US007193421B2

(12) United States Patent
Frey et al.

(10) Patent No.: US 7,193,421 B2
(45) Date of Patent: Mar. 20, 2007

(54) METHOD AND DEVICE FOR DETERMINING THE STATE OF A VEHICLE BATTERY

(75) Inventors: Wunibald Frey, Schwieberdingen (DE); Helmut Meyer, Gerlingen (DE); Marc Knapp, Erdmannhausen (DE)

(73) Assignee: Robert Bosch GmbH, Stuttgart (DE)

( * ) Notice: Subject to any disclaimer, the term of this patent is extended or adjusted under 35 U.S.C. 154(b) by 315 days.

(21) Appl. No.: 10/760,978

(22) Filed: Jan. 20, 2004

(65) Prior Publication Data
US 2004/0189310 A1     Sep. 30, 2004

(30) Foreign Application Priority Data
Jan. 17, 2003  (DE)  ............................... 103 01 529

(51) Int. Cl.
*G01N 27/416* (2006.01)
(52) U.S. Cl. ...................................... 324/428; 320/149

(58) Field of Classification Search ................ 324/426, 324/428; 320/149
See application file for complete search history.

(56) References Cited

U.S. PATENT DOCUMENTS

| 4,388,618 A | 6/1983 | Finger |
| 6,356,083 B1 * | 3/2002 | Ying .......................... 324/426 |
| 6,359,419 B1 * | 3/2002 | Verbrugge et al. .......... 320/132 |
| 6,522,148 B2 * | 2/2003 | Ochiai et al. ................ 324/428 |

FOREIGN PATENT DOCUMENTS

| DE | 198 45 562 | 4/2000 |
| WO | WO 02/31791 | 4/2002 |

* cited by examiner

*Primary Examiner*—Karl Easthom
*Assistant Examiner*—Aaron Piggush
(74) *Attorney, Agent, or Firm*—Kenyon & Kenyon LLP

(57) ABSTRACT

A method and a device for determining the state of a vehicle battery in which the battery voltage is measured and information regarding the state of the vehicle battery is derived from the measured battery voltage by means of an integration procedure. A variable weighting factor is taken into account in the integration procedure.

6 Claims, 2 Drawing Sheets

METHOD AND DEVICE FOR DETERMINING THE STATE OF A VEHICLE BATTERY

BACKGROUND INFORMATION

To increase the availability in vehicle electrical systems that place high demands on a permanent energy supply, it is already known to use electrical system topologies that include an auxiliary battery. The state of the main battery is ascertained via an electronic battery management, in a relatively costly manner, and the auxiliary battery is switched in as a function of a constant threshold value. The battery current, the battery voltage and the battery temperature are normally used to determine the battery state.

From German Patent No. DE 198 45 562, a method for ascertaining the state of the electrical system of a vehicle is known that uses the measurement of the battery voltage. In that procedure, the battery voltage is averaged over a longer period of time. A critical state is recognized when the voltage drops below a defined voltage threshold.

SUMMARY OF THE INVENTION

The method according to the present invention has the advantage of a more precise detection of the state of the vehicle battery. By taking a variable weighting factor into account when determining the state of a vehicle battery, short-term events and long-term effects that, if not considered, would lead to imprecise or even false statements regarding the state of the vehicle battery, are able to be taken into account in an appropriate manner. An example of a short-term event is an occurring load jump, which results in a brief voltage drop. An example of a long-term effect is the aging of the vehicle battery.

An additional advantage of the present invention is that the state of a vehicle battery is ascertained in a simple and cost-reduced manner.

Due to the more precise determination of the state of the vehicle battery, the method of operation of an electrical energy management to which the ascertained information regarding the state of the vehicle battery is supplied is improved. Furthermore, the connecting of the auxiliary battery is optimized in vehicle electrical system topologies utilizing an auxiliary battery.

An additional advantage of the present invention is that the method does not require a complicated measurement of the battery current.

The weighting factor is preferably calculated according to the correlation according to the present invention. In this way, the accuracy of determining the state of a vehicle battery may be improved by a multitude of different status information being taken into account.

Particular advantages of the method according to the present invention are a simple and cost-effective realization.

DETAILED DESCRIPTION

Figure 1:
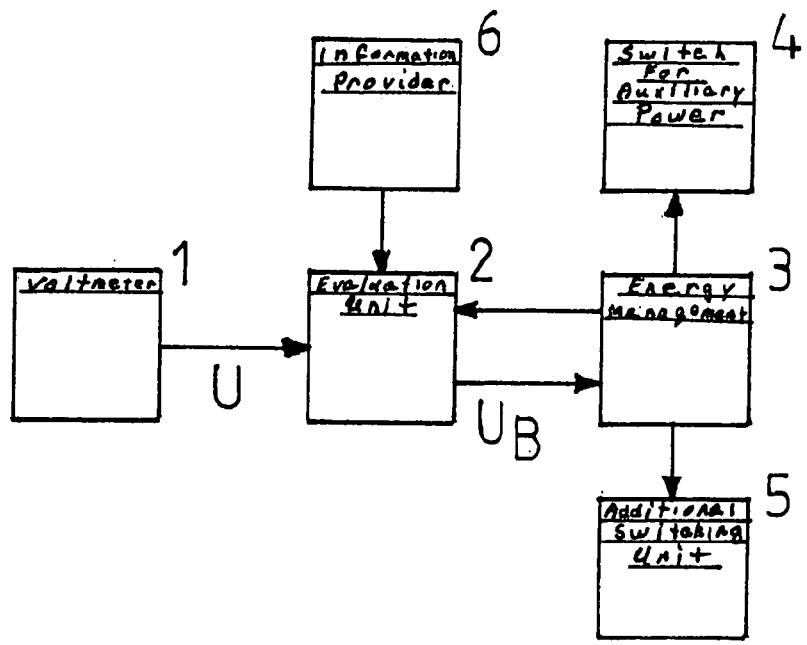
FIG. 1 shows a block diagram of a device for determining the state of a vehicle battery.

FIG. 1 shows a block diagram of a device for determining the state of a vehicle battery. This device has a voltmeter 1 for measuring the battery voltage. The output signals of voltmeter 1 are conveyed to an evaluation unit 2, which, using the signals received from voltmeter 1 and preferably using additional signals, provides at its output a signal $U_B$ that describes the state of the vehicle battery. In the following, the mentioned additional signals are also called status information. Signal $U_B$ is supplied to energy management 3 of the vehicle. Energy management 3 influences the available energy in the vehicle and the energy consumption.

If signal $U_B$ supplied to energy management 3 signals the presence of a poor state of the vehicle battery, energy management 3 takes suitable countermeasures to improve the charge balance of the vehicle battery so as to ensure that the safety-relevant components of the vehicle continue working. Among these safety-relevant components are, for example, an electro-hydraulic brake and the power steering of the vehicle. Suitable countermeasures include energy management 3 closing a switch 4 to connect an auxiliary battery. In addition thereto, or as an alternative, energy management 3 also supplies control signals to an additional switching unit 5 by way of which vehicle loads that are not safety-relevant are switched off, or are at least reduced in their power consumption, to lower the energy usage. Such not safety-relevant loads are the rear window heater of the vehicle and the seat heater, for instance.

The additional signals, which evaluation unit 2 preferably uses to determine signal $U_B$ describing the state of the vehicle battery, are provided to evaluation unit 2 by an information provider 6 and/or energy management 3, for example. These are additional available information from the vehicle electrical system. Among such additional information are data regarding the temperature of the battery, information on the energy state of the vehicle, information regarding load jumps occurring in the vehicle electrical system, information on occurring voltage dips, information on the battery current and information regarding the open-circuit voltage. The mentioned information is transmitted to evaluation unit 2 via the CAN bus of the vehicle. It may also be supplied to evaluation unit 2 directly from the particular information source, or supplied via other bus configurations.

Exemplary embodiments of the present invention are explained in greater detail in the following on the basis of FIGS. 2–4.

Figure 2:
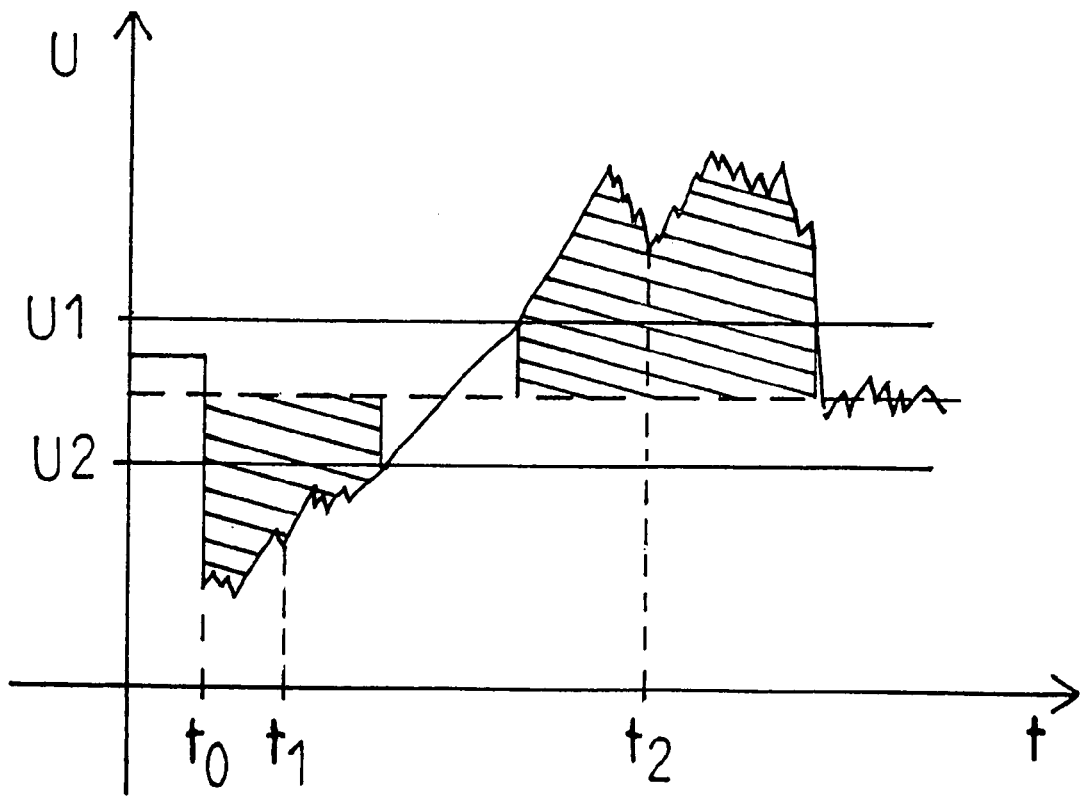
FIG. 2 shows a drawing to illustrate the method of functioning of a device according to a first exemplary embodiment of the present invention.

FIG. 2 shows a drawing illustrating the method of functioning of a device according to a first exemplary embodiment of the present invention. In this first exemplary embodiment, battery voltage U measured by voltmeter 1 is conveyed to evaluation unit 2. Evaluation unit 2 has an integrator, which is started after each vehicle start-up, following an initialization and an evaluation of the battery closed-circuit current. It calculates a voltage integral L(t), which provides information on the charge balance of the vehicle battery, according to the following correlation:

$$L(t) = \int_{t_0}^{t} D(\tau) \cdot a[U(\tau)] \, d\tau.$$

D(T) is a differential function reading as follows:

$$D(\tau) = U(\tau) - \frac{U1 + U2}{2}$$

U1 is a predefined upper voltage threshold value, U2 a predefined lower voltage threshold value. These voltage threshold values are predefined as a function of the particular application.

If a measured voltage value is below lower voltage threshold value U2, the battery is discharged. For the sake of simplification, it is assumed here that the voltage level represents a measure of the discharging current of the vehicle battery. Therefore, the voltages in this range render a negative contribution to the integral formation. For example, it holds:

$$D(t_1) = U(t_1) - \frac{U1 + U2}{2} < 0.$$

For measured voltage values that are below lower voltage threshold value U2, the weighting factor a[U(T)] has the value 1.

If a measured voltage value lies between the two voltage threshold values U1 and U2, it is not definitely established whether the battery is being charged or discharged at that particular time. Since the charging and discharging currents are low in this voltage range, they do not have a significant effect on the charge state of the vehicle battery. This voltage range is not considered in the integral formation. This is accomplished in that the weighting factor a[U(T)] is set to zero in this voltage range.

If a measured voltage value is above upper voltage threshold value U1, the battery is charged. It is assumed here for the sake of simplification that the voltage level represents a measure of the charging current of the vehicle battery. Therefore, the voltages in this range render a positive contribution in the integral formation. For example, it applies:

$$D(t_2) = U(t_2) - \frac{U1 + U2}{2} > 0.$$

The weighting factor a[U(T)] has the value 1 for measured voltage values that are above upper voltage threshold value U1.

Consequently, weighting factor a[U(T)] is variable. It is a function of the measured battery voltage, and the following overall correlation applies:

$$a(U) = \begin{cases} 0 & \text{for } U2 \leq U \leq U1 \\ 1 & \text{for } U2 > U \text{ or } U1 < U. \end{cases}$$

The ascertained voltage integral L is compared in evaluation unit 2 to a predefined limit value G. If the ascertained voltage integral L falls below this limit value, evaluation unit 2 generates a charge state signal $U_B$, which signals energy management 3 that the charge state of the vehicle battery is insufficient. Energy management 3 thereupon initiates measures to improve the charge balance. For example, a switch 4 is closed in order to switch in an auxiliary battery. Alternatively, or in addition, energy management 3 may also generate control signals for switching unit 5, thereby switching off vehicle loads that are not safety-relevant, or reducing their power consumption.

If ascertained voltage integral L is above limit value G, the auxiliary battery remains switched off and the not safety-relevant consumers remain in operation, provided they are activated just then.

Figure 3:
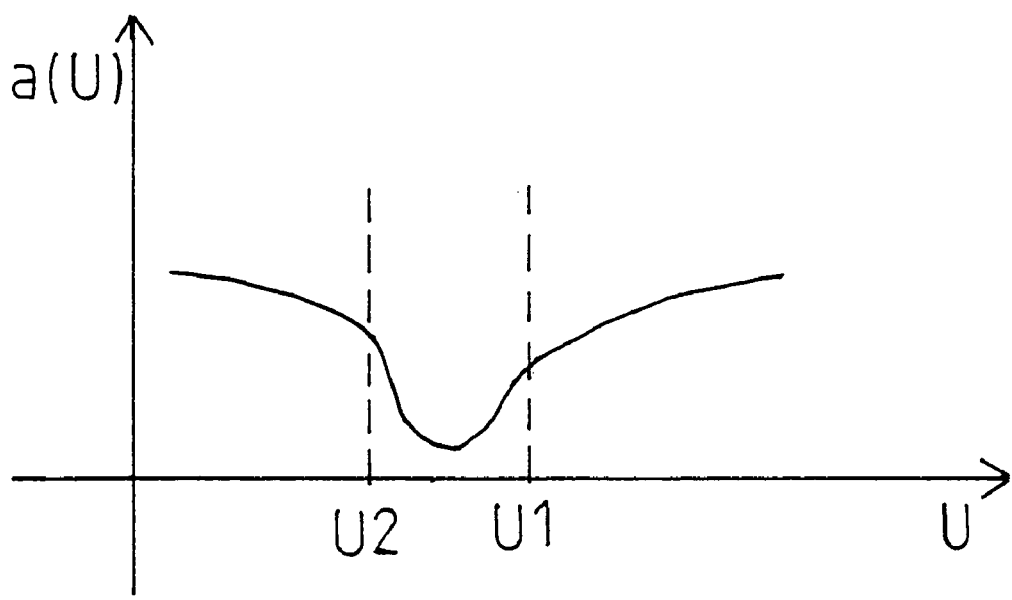
FIG. 3 shows a drawing illustrating the method of functioning of a device according to a second exemplary embodiment of the present invention.

FIG. 3 shows a drawing to illustrate the method of functioning of a device according to a second exemplary embodiment of the present invention. In contrast to the first exemplary embodiment, in this second exemplary embodiment the dependence of the battery current on the instantaneous voltage goes into weighting factor a as well. Therefore, weighting factor a, in contrast to the first exemplary embodiment, is no longer sectionally constant, but, for example, has a profile as illustrated in FIG. 3. It is the objective in this exemplary embodiment to characterize function i(Batt)=I(t) as precisely as possible by the expression D(t)·a[U(t)].

In this exemplary embodiment, too, the ascertained information $U_B$ regarding the charge state of the vehicle battery is converted in energy management 3 into control signals for switch 4 and/or switching unit 5.

Figure 4:
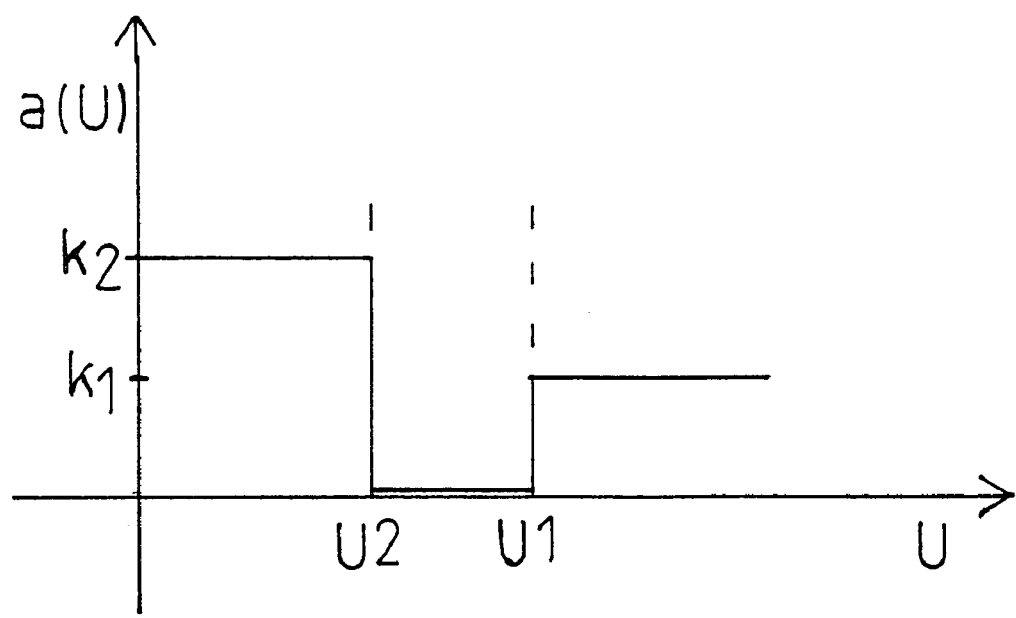
FIG. 4 shows a drawing illustrating the method of functioning of a device according to a third exemplary embodiment of the present invention.

FIG. 4 shows a drawing to illustrate the method of functioning of a device according to a third exemplary embodiment of the present invention. In this third exemplary embodiment, variable weighting factor a is calibrated by a charge-state determination using a measurement of the open-circuit voltage. In the process, various form parameters that go into the weighting factor are dynamically adapted, using correction data that were obtained after a vehicle start-up. This has the result that the charge balance determination for which an integral formation is implemented continually improves over time in the sense of a self-adaptation.

In this exemplary embodiment, the following correlation applies in general:

$$a(U) = a(k_1, k_2, \ldots, k_n; U).$$

As a result, weighting factor a is a function of measured voltage U and a multitude of prefactors $k_1, k_2, \ldots, k_n$.

The following applies:

$$a(U) = k_1 \cdot a_1(U) + k_2 \cdot a_2(U) + \ldots + k_n \cdot a_n = \sum_{i=1}^{n} k_i \cdot a_i(U).$$

Each prefactor $k_i$ is ascertained in a self-adaptive manner and is a function of a plurality of parameters:

$$k_i = k_i(\tau; \partial; \ldots).$$

FIG. 4 illustrates a simple exemplary embodiment in which it is assumed that only two weight functions $a_1(U)$ and $a_2(U)$ are entered into the calculation of the weighting factor, a prefactor $k_1$ and $k_2$, respectively, being assigned to each of these weight functions. According to this simple exemplary embodiment, it applies:

$$a(U) = k_1 \cdot a_1(U) + k_2 \cdot a_2(U).$$

Furthermore, it was assumed in this simplified exemplary embodiment that a sectional constancy is present, as it can be gathered from FIG. 4.

Generally, any desired prefactors $k_1$ may be used for the different weight functions in this exemplary embodiment. These prefactors are variable and may be obtained by means of a calibration and by other available information, such as status information from the electrical energy management, information on load jumps and information regarding voltage dips in the vehicle electrical system. In practice, it is useful to restrict oneself to two or three weight functions selected as a function of the given application and to the associated prefactors.

Examples for such weight functions are:

$a_1(U) = \text{sign}(U-US)+1,$ $a_2(U) = \text{sign}(U-US)-1,$ where $$\text{sign}(x) = \begin{cases} -1 & \text{for } x < 0 \\ 0 & \text{for } x = 0 \\ 1 & \text{for } x > 0; \end{cases}$$

or $a_1(U) = \text{gew}(U-U1),$ $a_2(U) = \text{gew}(U=U2),$ with $$\text{gew}(x) = \begin{cases} 0 & \text{for } x \leq 0 \\ 1 & \text{for } 0 < x < 1 \\ 2 - 1/2 & \text{for } 1 \leq x \leq 3 \\ 1/2 & \text{for } 3 < x. \end{cases} \text{ applying}$$

US, U1 and U2 are suitable voltage threshold values.

As a result, the present invention provides a procedure for determining the state of a vehicle battery and thus also the onboard electrical system of a vehicle that is able to be implemented in a simple and cost-effective manner. In the process, the battery voltage is measured and conveyed to an evaluation unit where an integration procedure is carried out in which a variable weighting factor is taken into account. The weighting factor may exclusively be a function of the measured battery voltage or additionally also of other variables.

What is claimed is:

1. A method for determining a state of a vehicle battery, the method comprising:
   measuring a voltage of the battery;
   deriving information regarding the state of the battery from the measured battery voltage using an integration procedure, a variable weighting factor being taken into account in the integration procedure, wherein the weighting factor is a function of the measured battery voltage;
   predefining an upper voltage threshold value and a lower voltage threshold value; and
   determining the weighting factor according to the following correlation:
   if a measured battery voltage value lies between the upper and lower voltage threshold values, the weighting factor has the value 0, and
   if a measured battery voltage value is one of less than the lower voltage threshold value and greater than the upper voltage threshold value, the weighting factor has the value 1.

2. The method according to claim 1, further comprising forming a difference within the framework of the integration procedure in which half of a sum of the upper and lower voltage threshold values is subtracted from the measured battery voltage.

3. The method according to claim 2, wherein the following correlation is used to ascertain the information regarding the state of the vehicle battery:

$$L(t) = \int_{t_0}^{t} D(\tau) \bullet a[U(\tau)] d\tau$$

where it applies:

$$D(\tau) = U(\tau) - \frac{U1 + U2}{2}$$

and L(t) being the voltage integral; D(τ) a differential function; a[U(τ)] the weighting factor, where a is a function of U(τ), a measured battery voltage value; U1 the upper voltage threshold value; and U2 the lower voltage threshold value.

4. A device for determining a state of a vehicle battery, comprising:
   a battery voltmeter; and
   an evaluation unit coupled to the battery voltmeter for deriving information regarding the state of the vehicle battery as a function of a measured battery voltage using an integration procedure, the evaluation unit taking into account a variable weighting factor in the integration procedure, wherein the weighting factor is a function of the measured battery voltage;
   wherein the evaluation unit calculates the weighting factor according to the following correlation:

$$a(U) = \begin{cases} 0 \text{ for } U2 \leq U \leq U1 \\ 1 \text{ for } U2 > U \text{ or } U1 < U, \end{cases}$$

U1 being a predefined upper voltage threshold value, U2 a predefined lower voltage threshold value, and U being measured battery voltage.

5. The device according to claim 4, wherein the evaluation unit implements the following differential formation:

$$D(\tau) = U(\tau) - \frac{U1 + U2}{2}$$

U1 being a predefined upper voltage threshold value, U2 being a predefined lower voltage threshold value, and U(τ) being a measured battery voltage value.

6. The device according to claim 5, wherein the evaluation unit implements the following integration procedure:

$$L(t) = \int_{t_0}^{t} D(\tau) \cdot a[U(\tau)] d\tau$$

L(t) being a voltage integral and a[U(τ)] being the weighting factor.

* * * * *